(12) United States Patent
Guillet et al.

(10) Patent No.: US 7,298,023 B2
(45) Date of Patent: Nov. 20, 2007

(54) ELECTRONIC DEVICE WITH ORGANIC INSULATOR

(75) Inventors: Erwann Guillet, Vaugon (FR); Peter Bonzani, East Hartford, CT (US); Walter Fix, Fürth (DE); Henning Rost, Erlangen (DE); Andreas Ullmann, Fürth (DE)

(73) Assignee: PolyIC GmbH & Co. KG, Furth (DE)

( * ) Notice: Subject to any disclaimer, the term of this patent is extended or adjusted under 35 U.S.C. 154(b) by 0 days.

(21) Appl. No.: 10/492,922

(22) PCT Filed: Sep. 5, 2002

(86) PCT No.: PCT/DE02/03292

§ 371 (c)(1),
(2), (4) Date: Apr. 14, 2004

(87) PCT Pub. No.: WO03/038921

PCT Pub. Date: May 8, 2003

(65) Prior Publication Data

US 2005/0048803 A1    Mar. 3, 2005

(30) Foreign Application Priority Data

Oct. 16, 2001 (DE) .............................. 101 51 036

(51) Int. Cl.
*H01L 23/58* (2006.01)
(52) U.S. Cl. ..................... 257/642; 257/632
(58) Field of Classification Search ............... 257/787, 257/635, 642, 643, 792, 793, 783, 632
See application file for complete search history.

(56) References Cited

U.S. PATENT DOCUMENTS

| | | |
|---|---|---|
| 3,512,052 A | 5/1970 | Maciver et al. |
| 3,769,096 A | 10/1973 | Ashkin |
| 3,955,098 A | 5/1976 | Kawamoto |
| 4,302,648 A | 11/1981 | Sado et al. |
| 4,340,657 A | 7/1982 | Rowe |
| 4,442,019 A | 4/1984 | Marks |
| 4,666,735 A * | 5/1987 | Hoover et al. ............... 427/510 |
| 4,865,197 A | 9/1989 | Craig |
| 4,926,052 A | 5/1990 | Hatayama |
| 4,937,119 A | 6/1990 | Nickles et al. |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takahira |
| 5,347,144 A | 9/1994 | Garnier et al. |
| 5,364,735 A | 11/1994 | Akamatsu et al. |
| 5,480,839 A | 1/1996 | Ezawa et al. |
| 5,486,851 A | 1/1996 | Gehner et al. |
| 5,546,889 A | 8/1996 | Wakita et al. |
| 5,569,879 A | 10/1996 | Gloton et al. |
| 5,574,291 A | 11/1996 | Dodabalapur et al. |
| 5,578,513 A | 11/1996 | Maegawa |
| 5,625,199 A | 4/1997 | Baumbach et al. |
| 5,652,645 A | 7/1997 | Jain |
| 5,691,089 A | 11/1997 | Smayling |
| 5,705,826 A | 1/1998 | Aratani et al. |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,967,048 A | 10/1999 | Fromson et al. |
| 5,970,318 A | 10/1999 | Choi et al. |
| 5,973,598 A | 10/1999 | Beigel |
| 5,994,773 A | 11/1999 | Hirakawa |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,072,716 A | 6/2000 | Jacobsen et al. |
| 6,083,104 A | 7/2000 | Choi |
| 6,087,196 A | 7/2000 | Sturm et al. |
| 6,133,835 A | 10/2000 | De Leeuw et al. |
| 6,150,668 A | 11/2000 | Bao et al. |

(Continued)

FOREIGN PATENT DOCUMENTS

DE        33 38 597        5/1985

(Continued)

OTHER PUBLICATIONS

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

(Continued)

*Primary Examiner*—S. V. Clark
(74) *Attorney, Agent, or Firm*—Carella, Byrne; Elliot M. Olstein; William Squire

(57) ABSTRACT

The invention concerns an insulator for an organic electronic component, in particular, for an organic field-effect transistor (OFET) or for an organic capacitor. The insulating material is characterized in that it includes an almost constant relative dielectric constant, even in case of frequency variation in wide ranges, for example, between 1 Hz and 100 kHz.

13 Claims, No Drawings

U.S. PATENT DOCUMENTS

| | | | |
|---|---|---|---|
| 6,197,663 B1 | 3/2001 | Chandross et al. | |
| 6,207,472 B1 | 3/2001 | Callegari et al. | |
| 6,207,522 B1* | 3/2001 | Hunt et al. | 438/393 |
| 6,215,130 B1 | 4/2001 | Dodabalapur | |
| 6,221,553 B1 | 4/2001 | Wolk et al. | |
| 6,251,513 B1 | 6/2001 | Rector et al. | |
| 6,284,562 B1 | 9/2001 | Batlogg et al. | |
| 6,300,141 B1 | 10/2001 | Segal et al. | |
| 6,304,232 B1* | 10/2001 | Brown et al. | 343/895 |
| 6,315,883 B1* | 11/2001 | Mayer et al. | 205/123 |
| 6,321,571 B1 | 11/2001 | Themont et al. | |
| 6,322,736 B1 | 11/2001 | Bao et al. | |
| 6,329,226 B1 | 12/2001 | Jones et al. | |
| 6,330,464 B1 | 12/2001 | Colvin et al. | |
| 6,335,539 B1 | 1/2002 | Dimitrakopoulos et al. | |
| 6,340,822 B1 | 1/2002 | Brown et al. | |
| 6,344,662 B1 | 2/2002 | Dimitrakopoulos et al. | |
| 6,362,509 B1 | 3/2002 | Hart | |
| 6,384,804 B1 | 5/2002 | Dodabalapur et al. | |
| 6,388,636 B1* | 5/2002 | Brown et al. | 343/866 |
| 6,403,396 B1 | 6/2002 | Gudesen et al. | |
| 6,429,450 B1 | 8/2002 | DeLeeuw et al. | |
| 6,498,114 B1 | 12/2002 | Amundson et al. | |
| 6,517,995 B1 | 2/2003 | Jacobson et al. | |
| 6,555,840 B1 | 4/2003 | Hudson et al. | |
| 6,593,690 B1 | 7/2003 | McCormick et al. | |
| 6,603,139 B1 | 8/2003 | Tessler et al. | |
| 6,621,098 B1 | 9/2003 | Jackson et al. | |
| 6,695,985 B2* | 2/2004 | Igarashi et al. | 252/518.1 |
| 6,852,583 B2 | 2/2005 | Bernds et al. | |
| 2001/0018124 A1* | 8/2001 | Yamakawa et al. | 428/346 |
| 2002/0018911 A1 | 2/2002 | Bemlus et al. | |
| 2002/0022284 A1 | 2/2002 | Heeger et al. | |
| 2002/0025391 A1 | 2/2002 | Angelopoulos et al. | |
| 2002/0037419 A1* | 3/2002 | Yamaguchi et al. | 428/461 |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0132896 A1* | 9/2002 | Nguyen | 524/404 |
| 2002/0170897 A1 | 11/2002 | Hall | |
| 2002/0195644 A1 | 12/2002 | Dodabalapur et al. | |
| 2003/0112576 A1 | 6/2003 | Brewer et al. | |
| 2003/0175427 A1 | 9/2003 | Loo et al. | |
| 2003/0222048 A1* | 12/2003 | Asakawa et al. | 216/2 |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0038459 A1* | 2/2004 | Brown et al. | 438/142 |
| 2004/0050816 A1* | 3/2004 | Asakawa et al. | 216/2 |
| 2004/0084670 A1 | 5/2004 | Tripsas et al. | |
| 2004/0211329 A1 | 10/2004 | Funahata et al. | |

FOREIGN PATENT DOCUMENTS

| | | |
|---|---|---|
| DE | 4243832 | 6/1994 |
| DE | 198 52312 | 5/1999 |
| DE | 198 16 860 | 11/1999 |
| DE | 198 51703 | 5/2000 |
| DE | 19851703 | 5/2000 |
| DE | 199 21024 | 11/2000 |
| DE | 695 19782 | 1/2001 |
| DE | 19933757 | 1/2001 |
| DE | 199 35 527 | 2/2001 |
| DE | 199 37 262 | 3/2001 |
| DE | 100 12204 | 9/2001 |
| DE | 10033112 | 1/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 100 06257 | 6/2002 |
| DE | 10061297 | 6/2002 |
| DE | 101 17 663 A1 | 10/2002 |
| DE | 101 20 687 | 10/2002 |
| DE | 102 19905 | 12/2003 |
| EP | 0 108650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 442123 | 12/1990 |
| EP | 0 418504 | 3/1991 |
| EP | 0460242 | 12/1991 |
| EP | 0 528662 | 8/1992 |
| EP | 0501456 A2 | 9/1992 |
| EP | 0501456 A3 | 9/1992 |
| EP | 0 511807 | 11/1992 |
| EP | 0685985 | 12/1995 |
| EP | 0716458 | 6/1996 |
| EP | 0 785 578 A2 | 7/1997 |
| EP | 0 785 578 A3 | 7/1997 |
| EP | 0 786820 | 7/1997 |
| EP | 0 615 256 B1 | 9/1998 |
| EP | 0 962984 | 12/1999 |
| EP | 0 979715 | 2/2000 |
| EP | 0981165 | 2/2000 |
| EP | 0989614 A2 | 3/2000 |
| EP | 1 048 912 | 11/2000 |
| EP | 1 052 594 | 11/2000 |
| EP | 1065725 A2 | 1/2001 |
| EP | 1065725 A3 | 1/2001 |
| EP | 1 083 775 A1 | 3/2001 |
| EP | 1 102 335 A2 | 5/2001 |
| EP | 1 104 035 A2 | 5/2001 |
| EP | 1 103916 | 5/2001 |
| EP | 1103916 | 5/2001 |
| EP | 1 134 694 | 9/2001 |
| EP | 1224999 | 7/2002 |
| EP | 1237207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 60117769 | 6/1985 |
| JP | 61001060 | 1/1986 |
| JP | 61167854 | 7/1986 |
| JP | 362065477 A | 3/1987 |
| JP | 01169942 | 7/1989 |
| JP | 05152560 | 6/1993 |
| JP | 05259434 | 10/1993 |
| JP | 05347422 | 12/1993 |
| JP | 08197788 | 8/1996 |
| JP | 09083040 | 3/1997 |
| JP | 09320760 | 12/1997 |
| JP | 10026934 | 1/1998 |
| JP | 2969184 B | 11/1999 |
| JP | 2001085272 | 3/2001 |
| WO | WO 93 16491 | 8/1993 |
| WO | WO 94/17556 | 8/1994 |
| WO | WO 95/06240 | 3/1995 |
| WO | WO 95 31831 | 11/1995 |
| WO | WO 96 02924 | 2/1996 |
| WO | WO 96/19792 | 6/1996 |
| WO | WO 97/12349 | 4/1997 |
| WO | WO 97/18944 | 5/1997 |
| WO | WO 98 18156 | 4/1998 |
| WO | WO 98 18186 | 4/1998 |
| WO | WO 98/40930 | 9/1998 |
| WO | WO 99/07189 | 2/1999 |
| WO | WO 99/10929 | 3/1999 |
| WO | WO 99 10939 | 3/1999 |
| WO | WO 99 21233 | 4/1999 |
| WO | WO 99 30432 | 6/1999 |

| | | |
|---|---|---|
| WO | WO 99 39373 | 8/1999 |
| WO | WO 99 40631 | 8/1999 |
| WO | WO 99/53371 | 10/1999 |
| WO | WO 99 54936 | 10/1999 |
| WO | WO 99/66540 | 12/1999 |
| WO | WO 00/33063 | 6/2000 |
| WO | WO 00/36666 | 6/2000 |
| WO | WO 01/03126 | 1/2001 |
| WO | WO 01/06442 | 1/2001 |
| WO | WO 01 08241 | 2/2001 |
| WO | WO 01 15233 | 3/2001 |
| WO | WO 01/15233 | 3/2001 |
| WO | WO 01/17029 | 3/2001 |
| WO | WO 01 17041 | 3/2001 |
| WO | WO 01/27998 | 4/2001 |
| WO | WO 01/46987 | 6/2001 |
| WO | WO 01/47044 | 6/2001 |
| WO | WO 01 47045 | 6/2001 |
| WO | WO 01 73109 A2 | 10/2001 |
| WO | WO 01 73109 A3 | 10/2001 |
| WO | WO 02/05360 | 1/2002 |
| WO | WO 02 05361 | 1/2002 |
| WO | WO 02/15264 | 2/2002 |
| WO | WO 02 19443 | 3/2002 |
| WO | WO 02/29912 | 4/2002 |
| WO | WO 02/43071 | 5/2002 |
| WO | WO 02/47183 | 6/2002 |
| WO | WO 02/065557 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 | 11/2002 |
| WO | WO 02 099907 | 12/2002 |
| WO | WO 02/099908 | 12/2002 |
| WO | WO 03/046922 | 6/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 04 042837 | 5/2004 |
| WO | WO 2004/042837 | 5/2004 |
| WO | WO 2004/083859 | 9/2004 |
| WO | WO 00 79617 | 12/2004 |

OTHER PUBLICATIONS

Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.

Gosain, D.P., "Excimer laser crystallized poly-si TFT's on plastic substrates", Second International Symposium on Laser Precision Microfabrication, May 16-18, 2001, Singapore, vol. 4426, pp. 394-400.

Lu, Wen et al., "Use of Ionic Liquids for π-Conjugated Polymer Electrochemical Devices", Science, vol. 297, 2002, pp. 983-987.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al, "Low Driving Voltages and Memory Effect in Organic Thin-Film Transistors With A Ferroelectric Gate Insulator", Applied Physics Letters, American Institute of Physics, New York, Vol. 179, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-oetylthiophene)", Macromolecules 1992, vol. 25, pp. 3284-3290.

U.S. Appl. No. 10/533,756, Organic Electronic Component with High-Resolution Structuring and Process for the Production Thereof, Wolfgang Clemens et al.

U.S. Appl. No. 10/534,678, Measuring Apparatus for Determining an Analyte in a Liquid Sample, Wolfgang Clemens et al.

U.S. Appl. No. 10/535,448, Organic Electronic Component Comprising a Patterned, Semiconducting Functional Layer and a Method for Producing Said Component, Wolfgang Clemens et al.

U.S. Appl. No. 10/535,449, Organic Electronic Component Comprising The Same Organic Material For At Least Two Functional Layers, Walter Fix et al.

U.S. Appl. No. 10/344,926, An Electronic Circuit Having An Encapsulated Organic-Electronic Component And A Method Formaking An Encapsulated Organic-Electronic Component, Adolf Bernds et al.

U.S. Appl. No. 10/541,815, Organo-Resistive Memory Unit, Axel Gerlt et al.

U.S. Appl. No. 10/541,956, Board of Substrate for an Organic Electronic Device and Use Thereof, Wolfgang Clemens et al.

U.S. Appl. No. 10/541,957, Organic Field Effect Transistor And Integrated Circuit, Walter Fix et al.

U.S. Appl. No. 10/533,756, Wolfgang Clemens et al.

U.S. Appl. No. 10/534,678, Wolfgang Clemens et al.

U.S. Appl. No. 10/535,448, Wolfgang Clemens et al.

U.S. Appl. No. 10/535,449, Walter Fix et al.

U.S. Appl. No. 10/344,926, Feb. 12, 2004, Adolf Bernds et al.

U.S. Appl. No. 10/541,815, Axel Gerlt et al.

U.S. Appl. No. 10/541,956, Wolfgang Clemens et al.

U.S. Appl. No. 10/541,957, Walter Fix et al.

Koezuka, H. et al., "Macromolecular Electronic Device", Mol. Cryst. Liq. Cyst. 1994, vol. 2555, pp. 221-230.

U.S. Appl. No. 10/533,756, Organic Electronic Component with High-Resolution Structuring and Process for the Production Thereof, Wolfgang Clemens et al.

U.S. Appl. No. 10/534,678, Measuring Apparatus for Determining an Analyte in a Liquid Sample, Wolfgang Clemens et al.

Dai, L. et al., "Conjugation of Polydienes by Oxidants Other Than Iodine", Elsevier Science S.A., Synthetic Metals 86 (1997) 1893-1894.

Dai, L. et al., "$I_2$-Doping" of 1,4-Polydienes, Elsevier Science S.A., Synthetic Metals 69 (1995), pp. 563-566.

Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.

Qiao, X. et al., "The FeCI3-doped poly3-alkithiophenes) in solid state", Elsevier Science, Synthetic Metals 122 (2001) pp. 449-454.

Garnier F et al:, "Vertical Devices Architecture By Molding Of Organic-Based Thin Film Transistor", Applied Physics Letters, American Institute Of Physics. XP000784120, issn: 0003-6951 abbildung 2.

Collet et al:, 'Low Voltage, 30 NM Channel Length, Organic Transistors With A Self-Assembled Monolayer as Gate Insulating Films:, Applied Physics Letters, American Institute of Physics, New York, US, Bd 76, Nr. 14, Apr. 3, 2000, Seiten 1941-1943, XP000950589, ISSN: 0003-6951, das ganze Dokument.

Hwang J D et al:, "A Vertical Submicron SIc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers, J. A. et al:, "Printing Process Suitable for Reel-to-Reel Production of High-Performance Organic Transistors and Circuits", Advanced Materials, VCH, Verlagsgesellschaft, Weinham, DE, Bd. 11, Nr. 9, Jul. 5, 1999, Seiten 741-745, P000851834, ISSN: 0935-9648, das ganze Dokument.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, linke Splate, Zeile 14; Abbildungen 1, 2.

Hergel, H. J.: "Pid-Programmiertechnologien", Elektronik, Franzis Verlag GMBH, Munchen, DE, Bd 41, Nr. 5, Mar. 3, 1992, Seiten 44-46, XP000293121, ISSN: 0013-5658, Abbildungen 1-3.

Forrest et al.: "The Dawn of Organic Electronics", IEEE Spectrum, Aug. 2000, Seiten 29-34, XP00218900, IEEE Inc., New York, US ISSN:0018-9235, Seite 33, rechte Spalte, Zelle 58-Seite 34, linke Spalte, Zeile 24; Abbildung 5.

Patent Abstracts of Japan, vol. 009, No. 274 (E-354), Oct. 31, 1985 & JP 60 117769 A (Fujitsu KK), Jun. 25, 1985 Zusammenfassung.

Zie Voor Titel Boek, de 2e PAGINA, XP-002189001, p. 196-228.

Drury et al., "Low-Cost All-Polymer Integrated Circuits", American Institute of Physics, Applied Physics Letters, 1998, vol. 73, No. 1, pp. 108-110, Jul. 6, 1998.

Kuhlmann et al., "Terabytes in Plastikfolie", Organische Massenspeicher vor der Serienproduktion.

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricatecd by Printing Techniques", Chem. Mater vol. 9, No. 6, 1997, pp. 1299-1301.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 010, No. 137, May 21, 1986 (JP 361001060 A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000, XP-002209726.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, pp. 95-102.

Clemens, W. et al., "Vom Organischen Transistor Zum Plastik-Chip," Physik Journal, V. 2, 2003, pp. 31-36.

Crone, B. et al, "Large-scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 1, No. 89, Aug. 2002, pp. 1735-1737.

Dodabalapur, A. et al., Organic smart pixels, American Institute of Physics, Applied Physics, Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291.

Bao, Z. et al., "Organic and Polymeric Materials for the Fabricators of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

U.S. Appl. No. 10/523,216, Electronic Component Comprising Predominantlyorganic Functional Materials and a Process for the Production thereof, Adolf Bernds et al.

U.S. Appl. No. 10/523,487, Electronic Device, Wolfgang Clemens et al.

U.S. Appl. No. 10/524,646, Organic Component for Overvoltage Protection and Associated Circuit, Walter Fix et al.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr. Seitenn 91-94.

Oelkrug, D. et al., "Electronic spectra of self-organized oligothiophene films with 'standing' and 'lying' molecular units", Elsevier Science S.A., 1996, Thin Solid Films 284-270.

Sandberg, H. et al, "Ultra-thin Organic Films for Field Effect Transistors", SPIE vol. 4466, 2001, pp. 35-43.

Chen, X.L. et al., "Morphological and Transistor Studies of Organic Molecular Semiconductor with Anisotropic Electrical Characteristics", American Chemical Society, 2001, Chem. Mater. 2001, 13, 1341-1348.

De Leeuw D.M. et al., "Polymeric integrated circuits and light-emitting diodes", Electron Devices Meeting, 1997, Technical Digest, International, Washington, DC, USA Dec. 7-10, 1997, New York, NY, USA, IEEE, US Dec. 7, 1997.

Lowe, J. et al., "Poly (3—(2—Acetoxyethyl)Thiophene): A Model Polymer for Acid-Catalyzed Lithography", Synthetic Metals, Elsevier Sequoia, Lausanne, Ch. Bd. 85, 1997, Seiten 1427-1430.

U.S. Appl. No. 10/508,640, Logic Component Comprising Organic Field Effect Transistors, Walter Fix et al.

U.S. Appl. No. 10/508,737, Device and Method for Laser Structuring Functional Polymers and the Uses Thereof, Adolf Bernds et al.

U.S. Appl. No. 10/517,750, Substrate for an Organic Field Effect Transistor, Use of the Substrate, Method of Increasing the Charge Carrier Mobility and Organic Field Effect Transistor (OFET), Wolfgang Clemens e a.

U.S. Appl. No. 10/344,951, Adolf Bernds et al.
U.S. Appl. No. 10/362,932, filed Oct. 2, 2003, Adolf Bernds et al.
U.S. Appl. No. 10/380,113, filed Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, filed Dec. 30, 2004, Adolf Bernds et al.
U.S. Appl. No. 10/479,238, Adolf Bernds et al.
U.S. Appl. No. 10/492,922, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/824,646, Walter Fix et al.

Harsanyi G. et al, "Polytronics for biogtronics:unique possibilities of polymers in biosensors and BioMEMS", IEEE Polytronic 2002 Conference, Jun. 23, 2002, pp. 211-215.

Fraunhofer Magazin, "Polytronic: Chips voon der Rolle", Nr. 4, 2001, pp. 8-13.

Prosandeev S. A. et al. "Characteristics and the Nature of the low-frequency dielectric response in moderately concentrated $KTaO:Li$"$_3$ Journal of Physics: Condensed Matter13 (2001) 9749-9760.

Rogers, John A. et al. "Organic Smart Pixels and Complementary Inverter Circuits Formed on Plastic Substrates by Casting and Rubber Stamping", IEEE Electron Devices Letters vol. 21, No. 3 Mar. 2000 pp. 100-103.

Kamba, S. et al. "Dielectric dispersion of the relaxor PLZT ceramics in the frequency range 20Hz-100THz" J. Phys. Conds. Matter 12 (2000) 497-519.

Kliem, Herbert, et al. "Dielectric Permittivity of $Si_3N_4$ and $SiO_2$ Increased by Electrode Profile and Material" 1999 Conference on Electrical Insulation and Dielectric Phenomena Institute of Electrical Engineering Physics Saarland University, Saarebrucken, Germany pp. 70-73.

Yasufuku Sachio, et al. "Dielectric and Thermoanalytical Behavior of Moisture and Water in Aromatic Polyamide and Polymide Films", Conference Record of the 1994 IEEE International Symposium on electrical insulation, Pittsburgh, PA Jun. 5-8, 1994 pp. 197-200.

* cited by examiner

ELECTRONIC DEVICE WITH ORGANIC INSULATOR

The invention concerns an insulator for an organic electronic component, in particular, for an organic field-effect transistor (OFET) and/or for an organic capacitor.

We know from C. J. Dury et al., Applied Physics Letters 73 1998, p. 108, that polyhydroxystyrene (PHS) is used as an insulator in OFETs. The main disadvantage of the material is that there is no known possibility thus far to structure the insulator economically. Loose ions inside the material represent an additional problem, which lead to an extremely low switching behavior. Moreover, PHS is relatively expensive.

Commercially available photosensitive resist (SC 100, Olin Hunt) was used as an insulator in a more recent publication (G. H. Gelinck et al, Applied Physics Letter 77 2000, p. 1,487). Due to the structuring of the photosensitive resist, the layers beneath suffer major corrosion or destruction, which is a substantial disadvantage of this method. This makes it practically impossible to use the insulator on already existing semiconductor layers such as, for example, polyalkylthiophene. However, the insulating layer above the semiconducting layer is deposited to produce the OFET, in which the source and/or drain electrodes are embedded. Damage to the already existing semiconducting layer cannot be tolerated during the manufacturing process.

Polyimide was also presented as insulating material (J. A. Rogers et al., IEEE Electron Devices Letters, Volume 21, Number 3, 2000, p. 100). Even when using the material, there is the fear of causing damage to the already finished OFET layers, since the material can only be processed at extremely high temperatures (~400° C.). Since organic semiconductors or conductors can typically survive only significantly lower temperatures without damage (less than 200° C.), polyimide cannot be used in filly organic OFETs.

Independent of the processing characteristics of the familiar materials, an insulator, whose dielectric constant remained basically constant when the emitted frequency is changed, could not be found thus far. Rather, all these materials demonstrate a frequency-dependent change in the dielectric constant, which affects entire ranges.

Therefore, it is the challenge of the present invention to provide an insulator for a field-effect transistor, which at least partially consists of organic material and which overcomes the disadvantages of prior art.

The subject matter of the invention concerns an insulator for an organic electronic component, in particular, for an organic field-effect transistor and/or a capacitor, which is at least partially based on organic material, where the dielectric constant of the insulating layer essentially remains constant in a frequency range between 1 Hz and 100 kHz.

According to one embodiment, the insulator is comprised of polyisobutylene or uncrosslinked EPDM (Ethylene Propylene Diene Monomer) as base polymer (main component), which are only soluble in nonpolar hydrocarbons (hexane, heptane). The homogenous thickness of the layer that can be achieved with the material is between approx. 2 µm and 250 µm, whereby these layers still possess sufficiently high insulation characteristics. The material can be structured very easily, thus permitting hole contacts, which is another major advantage of the material (e.g. by means of lithography).

According to another embodiment, the insulating material is comprised of a commercially available PVDC-PAN-PMMA copolymer with the general formula

wherein x, y, z, in each case, independently from one another, may assume values between 0 and 1, preferably values as indicated in the examples.

The PVDC PAN PMMA copolymer is preferably used in combination with HMMM (hexamethoxy methal melamine) and/or Cymel crosslink components, whose ratio can be varied widely (dissolved in dioxane). The material also permits very simple structuring without being crosslinked yet at the same time. The material can be crosslinked at very low temperatures (approx. 70° C.) and becomes then resistant to all subsequent steps that are necessary to complete an OFET and to put together an integrated circuit.

According to one embodiment, the insulating compound comprised of a base polymer with the general formula $$[A_x/B_{1-x}],$$

is used, wherein A, for example, is polyhydroxystyrene and B is poly(styrene-co-allyl-alcohol) such as, for example, polyvinyltoluol, poly(alpha-methylstyrene).

In particular, compounds such as, for example, [50% polyhydroxystyrene/50% poly(styrene-coallyl-alcohol)], dissolved in polar solvents such as, for example, dioxane, are preferred in this regard. A major advantage of the material is that a layer can be deposited on P3AT with very little damage.

Finally, according to another embodiment, an insulator is used comprising a compound of two copolymers, with the general formula $$[A_z/B_y],$$

wherein, in particular, a compound of poly(vinyltoluene-co-alpha-methylstyrene)/poly(styrene-co-allyl-alcohol) is suitable. The x and y indices may thereby be equal or unequal and assume values between 0.5 and 1. There is a particular preference for x and y to be equal. Again, the compound is preferably dissolved in polar solvents, in particular, dioxane.

Surprisingly, the materials mentioned fulfill characteristic profiles allowing their use, in particular, as insulating layer in OFETs. This is particularly so, since an insulating layer made up of one or a compound of several mentioned materials fulfills the following process, electrical and mechanical requirements and, at the same time, is a very inexpensive material system.

Process requirements:

The insulating layer easily dissolves in conventional organic solvents such as, for example, dioxane, butanol and other alcohols, etc.

Depositing the insulating layer onto already existing OFET layers (e.g. semiconductor layer) does not damage these layers, either through corrosion or etching, nor does it change their characteristics.

After depositing, the insulating layer can be structured. Also, structuring does not negatively affect existing layers. Structuring is absolutely necessary in order to create integrated circuits, which consist of several OFETs, since structuring is required to make link circuits between the gate electrode of one OFET and the source or drain electrode of another OFET possible.

After structuring, the insulating layer is chemically and thermally stabile vis-à-vis the process steps that are required to deposit and structure subsequent OFET layers (e.g. gate electrode).

b) Electrical requirements:

The relative dielectric constant of the insulating layer is nearly constant in a frequency range between 1 Hz and 100 kHz. The relative dielectric constant is considered "nearly constant" in this context, if it varies by 50% or less.

Preferably, the relative dielectric constant of the insulating layer has at least a value of about 2 for the mentioned systems, thus allowing OFETs to be produced that work at low voltage.

It is advantageous that leakage currents through the insulating layer, even in the case of very thin layers, are negligibly small vis-à-vis the source-drain current, i.e. they preferably lie below1 nA (depending on the OFET geometry).

The dielectric strength of the insulating layer is high and has a preferred value of at least $5*10^5$ V/cm.

Preferably, the insulating material should not contain any movable impurities (e.g. ions).

Preferably, the threshold voltage of the OFET is not displaced by the insulating system.

Mechanical requirements:

To a certain extent, the insulating layer is resistant against mechanical force such as bending, stretching or compressing.

Depositing the insulating layer by spin-coating, doctoring, printing or spraying is done in such a way as to create a plane-parallel, even, homogeneous layer free of defects.

To produce a complete OFET, structurable layers of either photosensitive resist or metal are deposited on the insulating layer. After structuring, the insulating layer can be precisely removed with suitable solvents and thus structured as well. This way, the insulating layer is always structured at temperatures below 100° C. so that processing in this way has no negative effect on already existing functional layers (e.g. semiconductors).

The excellent electrical characteristics, i.e., high dielectric constant, high breakdown voltage and low leakage currents of the material systems under consideration continue to permit the production of relatively thin insulating layers, which leads to a drastic reduction of the required gate voltage to preferred values below 10 V.

In this context, the term "organic material" or "organic functional polymer" comprises all kinds of organic, metal-organic and/or organic-inorganic synthetic materials (hybrids), particularly those, which are referred to, for example, in the English language, as "plastics." This concerns all types of materials with the exception of semiconductors, which form classic diodes (germanium, silicon), and the typical metallic conductors. Thus, dogmatically speaking, there are no plans of limiting the use to organic, that is, carbon-containing materials, rather, the wide use of, for example, silicon is also considered. Moreover, the term should not be subject to any limitations with regard to molecular size, in particular, limitations to polymer and/or oligomer materials, rather the use of "small molecules" is also quite possible. The word component "polymer" within functional polymer is historic and insofar contains no information about the existence of actual polymer compounds.

Following, the invention will be explained on the basis of some examples, which describe embodiments of the invention:

EXAMPLE I

Use of Polyisobutylene (PIB) as an Insulator 0.4 g of PIB (Aldrich) was dissolved in 9.6 g of hexane at room temperature;

the solution was filtered through a PTFE 0.45 µm syringe filter;

the solution was then spin-coated onto the substrate (4,000 rpm for 20 seconds), which was already fit with source/drain electrodes and semiconductors (top-gate design). The result was a very homogenous layer, approx. 260 nm thick;

the sample was dried under a dynamic vacuum for approx. 30 minutes at room temperature;

then a thick layer of photosensitive resist was deposited on the insulator, exposed and developed under normal circumstances;

the sample was immersed in a hexane bath and the insulator was stripped in the areas that were free of resist;

the remaining resist was removed with a suitable solvent;

EXAMPLE 2

Use of PVDC-PAN-PMMA (x=0.89, y=0.03, z=0.08) as Insulator 0.4 g of PVDC-co-PAN-co-PMMA (Aldrich) was dissolved in 9 g of dioxane at 40-50° C.

0.5 g of cymel 327 (Cytec Industries, Inc.) and 0.1 g of campher sulfonic acid were then added and stirred for a few seconds;

the solution was filtered through a PTFE 0.45 µm syringe filter;

the solution was spin-coated onto the substrate (8,000 rpm for 20 seconds), which was already fit with source/drain electrodes and semiconductors (top-gate design). The result was a very homogenous layer, approx. 400 nm thick;

the sample was dried under a dynamic vacuum for approx. 30 minutes at room temperature;

the layer was vacuum-coated with a thin gold layer, which in turn was structured by means of photolithography (photosensitive resistant, then etched with a potassium carbonate solution);

the deposited metal mask allows structuring of the insulating layer in that the now freed insulating surfaces can be removed with a toluene-soaked rag;

the remaining gold residue was removed with a potassium carbonate solution the last step was to crosslink the insulator (10 minutes at 90° C.).

EXAMPLE 3

Use of [50% polyhydroxystyrene/50% poly(styrene-co-allyl-alcohol) as insulator. The polymer compound was then dissolved with dioxane and filtered with a 0.2 µm filter. Then, the insulating layer was then pre-baked on the hot plate at 100° C. for 30 minutes. As in example 2, structuring is also carried out by means of "metal masks."

The insulating material according to the invention shows no substantial frequency-dependent variation of the dielectric constant. Either the orientation of existing anisotropic molecules or a lack of mobile charge carriers as well as mobile ions may be responsible for this phenomenon. At any rate, no significant variation of the dielectric constant, exceeding approx. 50%, could be established within a frequency range of almost 100 kHz.

The invention claimed is:

1. In an electronic device comprising at least one of an organic field effect transistor or capacitor, which transistor and capacitor comprises an insulator layer and includes electrical and mechanical requirements and which insulating layer fulfills the electrical and mechanical requirements of the transistor or capacitor, the improvement comprising:

the insulating layer being at least partially based on organic material, and wherein the dielectric constant of the insulating layer remains substantially constant within a frequency range between 1 Hz and 100 Hz;

the insulator layer comprising a base polymer of PVDC-PAN-PMMA copolymer with the general formula $(—CH_2Cl_2—)_x—(—CH_2CH(CN)—)_y—(CH_2C(CH_3)(CO_2CH_3)—)_z$, wherein x, y, z, in each case, independently from one another, may assume values between 0 and 1.

2. In the device in accordance with claim 1, wherein the insulator layer comprises one of polyisobutylene and uncrosslinked EPDM (Ethylene Propylene Diene Monomer) as a base polymer.

3. In an electronic device comprising at least one of an organic field effect transistor or capacitor, which transistor and capacitor comprises an insulator layer and includes electrical and mechanical requirements and which insulating layer fulfills the electrical and mechanical requirements of the transistor or capacitor, the improvement comprising:

the insulating layer being at least partially based on organic material, and wherein the dielectric constant of the insulating layer remains substantially constant within a frequency range between 1 Hz and 100 Hz and wherein the insulator layer comprises a base polymer with the general formula $[A_x/B_{1-z}]$, wherein A is polyhydroxystyrene and B is poly(styrene-co-alyl-alcohol), polyvinylalcohol and/or poly-alpha-methylstyrene.

4. In an electronic device comprising at least one of an organic field effect transistor or capacitor, which transistor and capacitor comprises an insulator layer and includes electrical and mechanical requirements and which insulating layer fulfills the electrical and mechanical requirements of the transistor or capacitor, the improvement comprising:

the insulating layer being at least partially based on organic material, and wherein the dielectric constant of the insulating layer remains substantially constant within a frequency range between 1 Hz and 100 Hz and wherein the insulator layer comprises as a base polymer a compound of two polymers, with the general formula $[A_z/B_y]$, with A equals poly(vinyltoluene-co-alpha-methylstyrene) and B equals poly(styrene-co-allyl-alcohol), wherein the values of z and y may be equal or unequal and assume values between 0.5 and 1.

5. In an electronic device comprising an organic field effect transistor including an insulator layer and having electrical and mechanical requirements, which insulating layer fulfills the electrical and mechanical requirements of the transistor, the improvement comprising:

the insulating layer being at least partially based on organic material, and wherein the dielectric constant of the insulating layer remains substantially constant within a frequency range between 1 Hz and 100 Hz and wherein the insulator layer comprises as a base polymer a compound of two polymers, with the general formula $[A_z/B_y]$, with A equals poly(vinyltoluene-co-alpha-methylstyrene) and B equals poly(styrene-co-allyl-alcohol), wherein the values of z and y may be equal or unequal and assume values between 0.5 and 1.

6. In an electronic device comprising an organic capacitor including an insulator layer and having electrical and mechanical requirements, which insulating layer fulfills the electrical and mechanical requirements of the capacitor, the improvement comprising:

the insulating layer being at least partially based on organic material, and wherein the dielectric constant of the insulating layer remains substantially constant within a frequency range between 1 Hz and 100 Hz and wherein the insulator layer comprises as a base polymer a compound of two polymers, with the general formula $[A_z/B_y]$, with A equals poly(vinyltoluene-co-alpha-methylstyrene) and B equals poly(styrene-co-allyl-alcohol), wherein the values of z and y may be equal or unequal and assume values between 0.5 and 1.

7. In the electronic device of claim 1 wherein the insulator layer is structured.

8. In the device in accordance with claim 3 wherein the base polymer is a compound comprising 50% polyhydroxystyrene and 50% poly(styrene-co-allyl-alcohol).

9. In the device in accordance with claim 4, wherein the values of x and y are equal.

10. In the device, in accordance with one of the claims 8, 9, and 3-4 wherein the base polymer is dissolved in one of a polar solvent and a polar mixture comprising at least two solvents.

11. In the device of any one of claim 1 and 3-6 including an electronic circuit formed on a surface of said insulating layer and electrically operatively coupled to the transistor or capacitor.

12. In the device of claim 1 including an OFET circuit formed on a surface of said layer and electrically operatively coupled to at least one of the transistor or capacitor.

13. In the device of claim 1 including a transistor circuit formed on a surface of said layer.

* * * * *